(12) United States Patent
Klatt

(10) Patent No.: US 7,659,606 B2
(45) Date of Patent: Feb. 9, 2010

(54) CONTACTING UNIT

(75) Inventor: Dieter Klatt, Wülfrath (DE)

(73) Assignee: STOCKO Contact GmbH & Co. KG (DE)

( * ) Notice: Subject to any disclaimer, the term of this patent is extended or adjusted under 35 U.S.C. 154(b) by 229 days.

(21) Appl. No.: 11/642,394

(22) Filed: Dec. 20, 2006

(65) Prior Publication Data

US 2007/0220539 A1   Sep. 20, 2007

(30) Foreign Application Priority Data

Dec. 21, 2005   (DE) .................. 10 2005 061 688

(51) Int. Cl.
| | |
|---|---|
| H01R 12/16 | (2006.01) |
| H01R 4/66 | (2006.01) |
| H01R 13/62 | (2006.01) |
| G06F 13/38 | (2006.01) |
| G06F 3/00 | (2006.01) |
| G06K 7/00 | (2006.01) |
| G06K 17/00 | (2006.01) |

(52) U.S. Cl. .................. 257/679; 439/108; 439/155; 439/326; 439/76.1; 439/945; 439/630; 725/6; 361/737; 361/752; 361/730; 361/736; 710/301; 710/305; 710/64; 235/441; 235/384; 235/486; 235/492

(58) Field of Classification Search .................. 257/679; 439/108, 155, 326, 76.1, 945, 377, 630; 235/441, 235/384, 486, 492; 710/301, 305, 64; 725/6; 361/737, 752, 730, 736
See application file for complete search history.

(56) References Cited

U.S. PATENT DOCUMENTS

| | | | | | |
|---|---|---|---|---|---|
| 5,739,515 | A | * | 4/1998 | Takemura | 235/441 |
| 5,877,488 | A | * | 3/1999 | Klatt et al. | 235/486 |
| 5,902,991 | A | * | 5/1999 | Kumar | 235/492 |
| 6,069,795 | A | * | 5/2000 | Klatt et al. | 361/737 |
| 6,132,223 | A | * | 10/2000 | Seeley et al. | 439/76.1 |
| 6,272,017 | B1 | * | 8/2001 | Klatt et al. | 361/737 |
| 6,276,944 | B1 | * | 8/2001 | Klatt | 439/76.1 |
| 7,252,231 | B2 | * | 8/2007 | Ho | 235/441 |
| 2004/0243748 | A1 | * | 12/2004 | Klatt et al. | 710/72 |
| 2005/0247784 | A1 | * | 11/2005 | Klatt | 235/441 |
| 2006/0205258 | A1 | * | 9/2006 | Cho et al. | 439/326 |

FOREIGN PATENT DOCUMENTS

JP   9-198470   *   7/1997

* cited by examiner

*Primary Examiner*—Alexander O Williams
(74) *Attorney, Agent, or Firm*—Cantor Colburn LLP

(57) ABSTRACT

Disclosed is a contacting unit, with plug-in card-shaped housing, having a base plate and a cover plate, between which a slit-like plug-in channel opening on one end of the housing is formed to receive a chip card, and which is provided on the other side with a connector strip, in which the plug-in channel is essentially open on both sides over its entire length in the plug-in direction of the chip card, and the base plate and the cover plate are firmly connected to each other only in the area connected to the plug-in channel in the plug-in direction, wherein at least one lateral guide device is arranged on one end on base plate and/or cover plate, which at least partially bounds the plug-in channel.

7 Claims, 4 Drawing Sheets

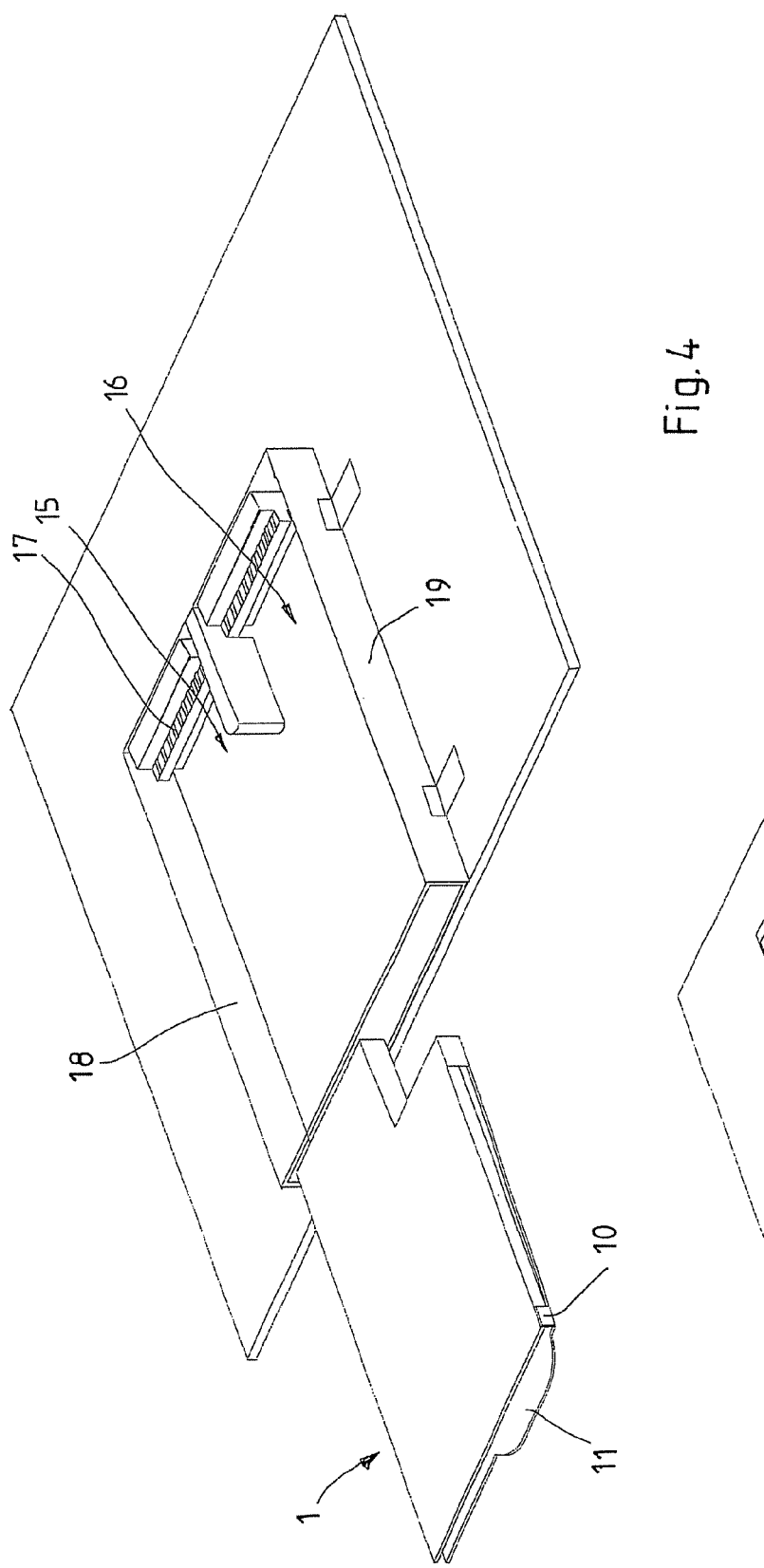

CONTACTING UNIT

BACKGROUND

1. Field

The invention relates to a contacting unit, especially according to the PCMCIA Standard, with a plug-in card-shaped housing that has a base plate and a cover plate essentially congruent in at least in the transverse direction, between which a slit-like plug-in channel to receive a chip card, opening on one side of the housing, is formed, and which is provided with a connector strip on the opposite side and with a circuit board arranged parallel to the plug-in channel in the housing, which is electrically connected to the connector strip and is provided on its surface with a contact field for contacting of the chip card, the plug-in channel being essentially open on both sides over its entire length in the plug-in direction of the chip card, and the base plate and the cover plate being firmly connected to each other exclusively in the area adjacent to the plug-in channel in the plug-in direction.

2. Prior Art

This type of contacting unit is known from DE 298 11 425 U1. The contacting unit makes it possible to connect a chip card to a connection of a data processing system, standardized according to the PCMCIA Standard. Combination of the PCMCIA card and a chip card contacting unit, which can be inserted into a corresponding module slot of a computer and read, is encountered in a wide variety of applications, for example, electronic banking, pay TV, securing of access authorization to data networks, etc. A shortcoming here is that the known chip card readers of this type have a housing extension that extends beyond the plug-in area of the module slot of the computer in the form of an enlarged plug-in guide for the chip card, which simultaneously represents a handling strip for the user. Because of this, the read devices are significantly longer than the standardized PCMCIA cards and protrude in the operating position with the extension area from the slot, for example, of a notebook, so that there is a hazard that the contacting unit during normal handling will jam in the slot or even be bent and damaged.

The extension area has thus far been deemed necessary, in order to guarantee reliable guiding of the chip card into and out of the slit-like plug-in channel without the hazard of tilting, and finally therefore to guarantee reliable introduction, locking and removal of a chip card.

With the continuously increasing use of portable computers, like laptops of notebooks, there is a technical demand that a chip card reader situated in the operating position be fully insertable into the slot of the computer without protruding parts interfering with handling. For example, this is important when personal authorization for the computer is to be carried out with a chip card that is plugged in. Contacting units are known that have no extension area and therefore correspond in length to the PCMCIA Standard, but are provided with closed side surfaces, in order to achieve lateral guiding of the chip card. This type of contacting unit is described, for example, in DE 29723227 U1. A drawback of the very thin-walled side surfaces is that during the slightest tilting of the chip cards during introduction into the contacting unit, the side surface can damage the chip card. Another drawback is that, if the side surfaces are deformed, introduction of a chip card is no longer possible. In addition, there is a hazard that, because of manufacturing tolerances of the contacting unit, problems will occur during introduction of the chip cards into the contacting unit.

In this respect, the contacting unit according to DE 298 11 425 U1 has proven of value, in which the plug-in channel is open on both sides over the entire length of the plug-in direction of the chip card, where the base plate and cover plate are only firmly connected to each other in the area adjacent to the plug-in channel in the plug-in direction. This type of contacting unit exactly corresponds in length and width to the PCMCIA Standard, for example, Type II, and can therefore be fully inserted into the PCMCIA slot of a computer, for example, a notebook, without parts protruding. Because of complete insertability, a hazard of damage, especially during transport, can be ruled out.

The generic contacting unit just described has proven of value. In particular, it has turned out to be advantageous to connect the base plate and cover plate only in the area of the connector strip, so that the opposite ends in the area of the plug-in channel are free. The cover plate and base plate can then be essentially parallel, or preferably sloped slightly toward each other. A chip card can be introduced without problem into the generic contacting unit, and the design of the generic contacting unit also forgives, in particular, tolerance errors in manufacture.

Versions of slots in computers and corresponding contact units have recently come on the market, which have different dimensions than the usual dimensions. For example, versions of slots are known, whose width, for example, is 68 mm, in which either two 34 mm wide (closed) contacting units or, as an alternative, one (laterally open) contacting unit with a guide width of 54 mm can be inserted in the slot of the computer. Such contacting units are known as PCMCIA-ExpressCards. The lateral limitations of the slot on the computer side cannot ensure in all cases that the chip card is always reliably guided and contacted.

SUMMARY

The underlying task of the invention is to modify the initially mentioned contacting unit, so that the chip card can always be reliably introduced to the contacting unit and contacted in it. Reliable contacting is also to be guaranteed in the introduced state.

This task is solved in the contacting unit according to the invention of the initially named type in that at least one guide device is arranged on one side on the base plate and/or cover plate, which at least partially bounds the plug-in channel laterally. Preferably, the guide device consists of at least one stub-like shoulder.

The guide device arranged on one or both sides of the contacting unit lies within the length standard and is designed, so that the base plate and the cover plate are not mechanically connected to each other in the proven fashion in the area of the plug-in slit of the contacting unit. A contacting unit with high contact reliability, based on the already described design, is therefore created according to the invention. Lateral pivoting of the chip card relative to the contacting unit is not possible. At the same time, a bias can advantageously occur over the pivot axis created by the connection of the base plate and the cover plate in the area of the connector strip. Naturally, the invention is also applicable in contacting units that are setup during manufacturing with a essentially parallel cover and base plates. In this case, the clamping force required for reliable seating of the chip card can be created by pressure devices lying within the housing.

The guide device preferably extends over the entire height of the plug-in channel. It can then be provided that the guide device(s) is (are) arranged on the lower base plate and that the upper cover plate extends, in each case, between a right and left side guide device arranged on the lower base plate. Right and/or left side guide devices arranged on the cover plate are also conceivable in the context of the idea of the invention.

It is proposed in an essential modification of the invention that the guide means have at least one shoulder assigned to the cover or base plate, which cooperates with a stop assigned to the respective other plate. This variant is particularly advantageous, to the extent that the height of the front area of the plug-in channel can be adjusted by the dimension of the shoulder or stop. For example, it is possible to adjust the base and cover plates essentially parallel to each other. It is also possible to adjust the cover plate and base plate at a slope to each other, so that a bias is produced that clamps the chip card being introduced. The shoulder and the corresponding stop are advantageously arranged in a plane lying essentially perpendicular to the plug-in channel.

Through the advantageous further development according to the invention, initially defined contacting units with a outward, essentially fully open plug-in channel can be manufactured independently of tolerances related to production. A defined clamping force of the base or cover plate, and especially reliable and securing contacting, are always guaranteed by the precise adjustment of the plug-in channel. To this extent, it is considered particularly advantageous that the shoulder and the stop determine the height of the plug-in channel (at least in its front area).

The shoulder and the corresponding stop can be designed freely over broad limits. The stop, for example, can be formed by the lower base plate of the upper cover plate itself. As an alternative, the stop can also be formed as a shoulder, which cooperates with the shoulder assigned to the other plate. In each case, it is essential to the invention that the shoulder and the corresponding stop are not connected to each other, but come in contact with each other.

As already initially mentioned, the invention finds particularly application in conjunction with contacting units that can be inserted into slots that are much larger than the contacting unit, so that a defined guiding of the chip card is not guaranteed. Tilting of the chip card in the contacting unit and/or the contacting unit and the corresponding slot can lead to a disconnecting of the connections and therefore failure of the card. In order for reliable introduction of a smaller—for example, 54 mm wide—contacting unit to be introduced to a larger—for example, 68 mm wide slot—it is expediently provided that the plug-in card-like housing have an introduction lip for the support element, which is arranged off-center. This design results in that the contacting unit during introduction is forced against the lateral wall of the slot and the plugs are therefore contacted in the correct alignment to each other.

BRIEF DESCRIPTION OF THE FIGURES

The invention is further explained below by means of advantageous practical examples in conjunction with the appended drawing. The drawing shows:

FIG. 4—schematic perspective view of a use possibility of the contacting unit according to the invention.

DETAILED DESCRIPTION

Figure 1:
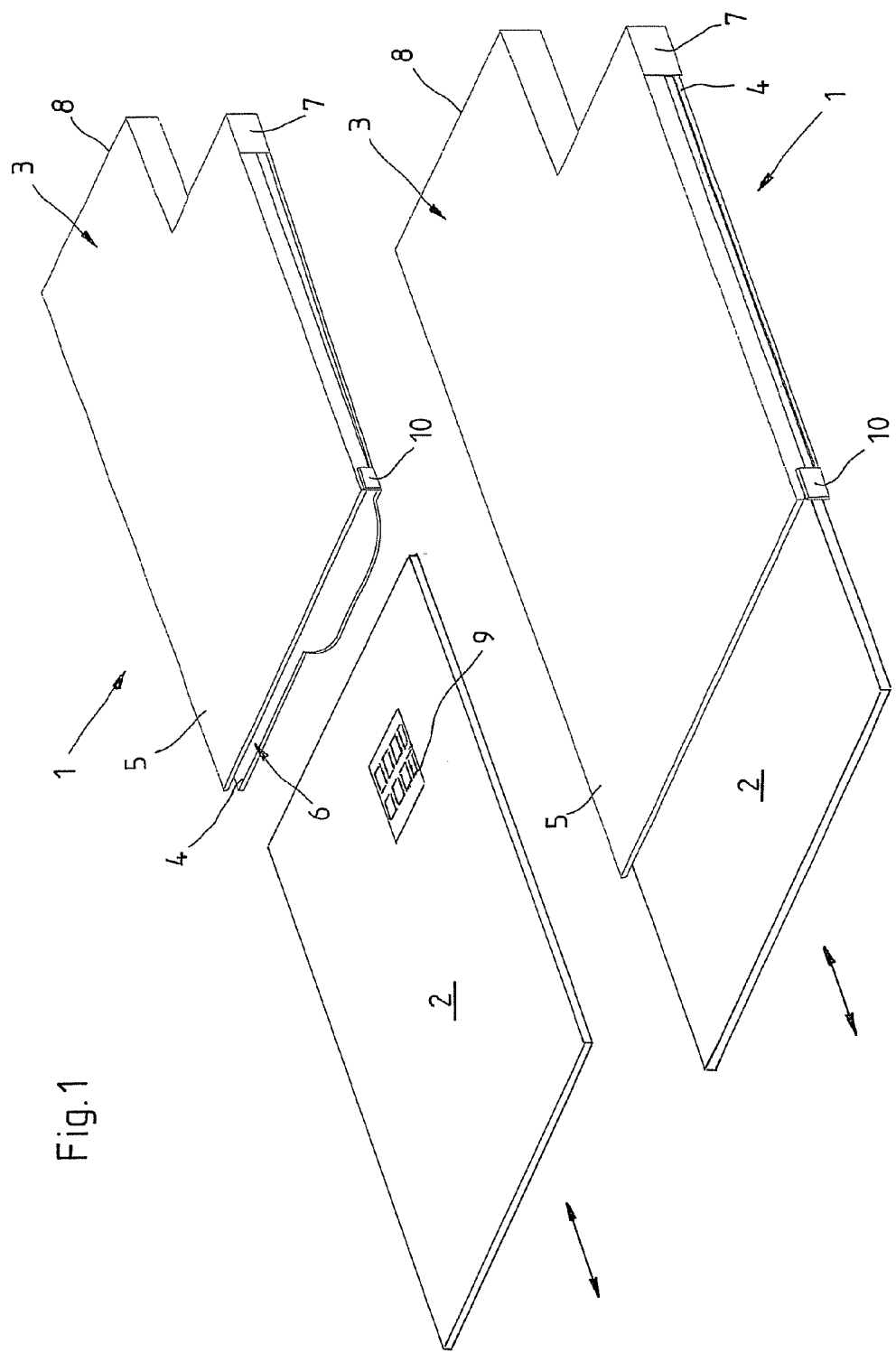
FIG. 1—schematic perspective view of the first practical example according to the invention.

FIG. 1 shows a first practical example of the contacting unit 1 according to the invention. A chip card 2, which is preferably designed according to ISO 7816, is insertable into the contact unit, as shown in the lower depiction in FIG. 1.

The contacting unit 1 consists of a two-shell outer housing 3, which has a lower base plate 4 and an upper cover plate 5. The plates 4, 5 form on one end a plug-in slot 6, into which the chip card 2 can be inserted. On the other end, the base plate 4 and the cover plate 5 extending parallel to it are firmly connected to each other in an area 7 that forms the pivot axis for the base plate 4 and the cover plate 5. The contacting unit 1 also has an area 8, in which a connector strip for contacting of a plug part on the device side is arranged, for example, in a notebook or PC.

The chip card 2 can be inserted in the direction of the double-arrow depicted in FIG. 1 into the contacting unit 1 and pulled out from it again, where contacting can be carried out through the chip field 9 of chip card 2 arranged on the surface and a contact field of a (not shown) circuit board, which permits processing of the chip card 2 when the contacting unit 1 is inserted into the plug-in slot of a device (PC; notebook) and connected to its PCMCIA interface via the connector strip arranged in section 8.

During introduction of the chip card 2 into the contacting unit 1, two things are of essential importance. In the first place, insertion of the chip card into the contacting unit should be readily possible. At the same, time, the contacting unit 1 should have a certain clamping force, so that the chip card 2 sits securely in the contacting unit. In the second place, during introduction of the chip card 2 into the contacting unit 1, it should be ensured that contacting (of the contact chip field 9) occurs correctly within the contacting unit 1. This is a basic requirement for the functioning of the contacting unit. With the chip card 2 already inserted into the contacting unit 1, secure seating of the chip card and correct contacting must also always be guaranteed. According to the invention, a lateral guide device 10 is arranged on the lower base plate 4 for this purpose, which guides the chip card during insertion and secures it in its inserted position. As is readily apparent on comparison of the upper figure with the still uninserted chip card 2 and the lower depiction with the already inserted chip card 2, the base plate 4 and the cover plate 5 are sloped slightly toward each other when the chip card 2 is not inserted. When the chip card 2 is inserted, the plates 4, 5 are spread and therefore provide a certain clamping force. The guide device 10 according to the invention does not hamper movement of the plates 4, 5.

In the depicted practical example, the guide device is provided only on one side of the contacting unit. This variant is used wherever the contacting unit 1 comes to lie against a slot wall in a slot on the device side, which serves as guide for the chip card. At the same time, it should be noted that two guide devices 10 according to the invention can also be used on both sides of the contacting unit.

Figure 2:
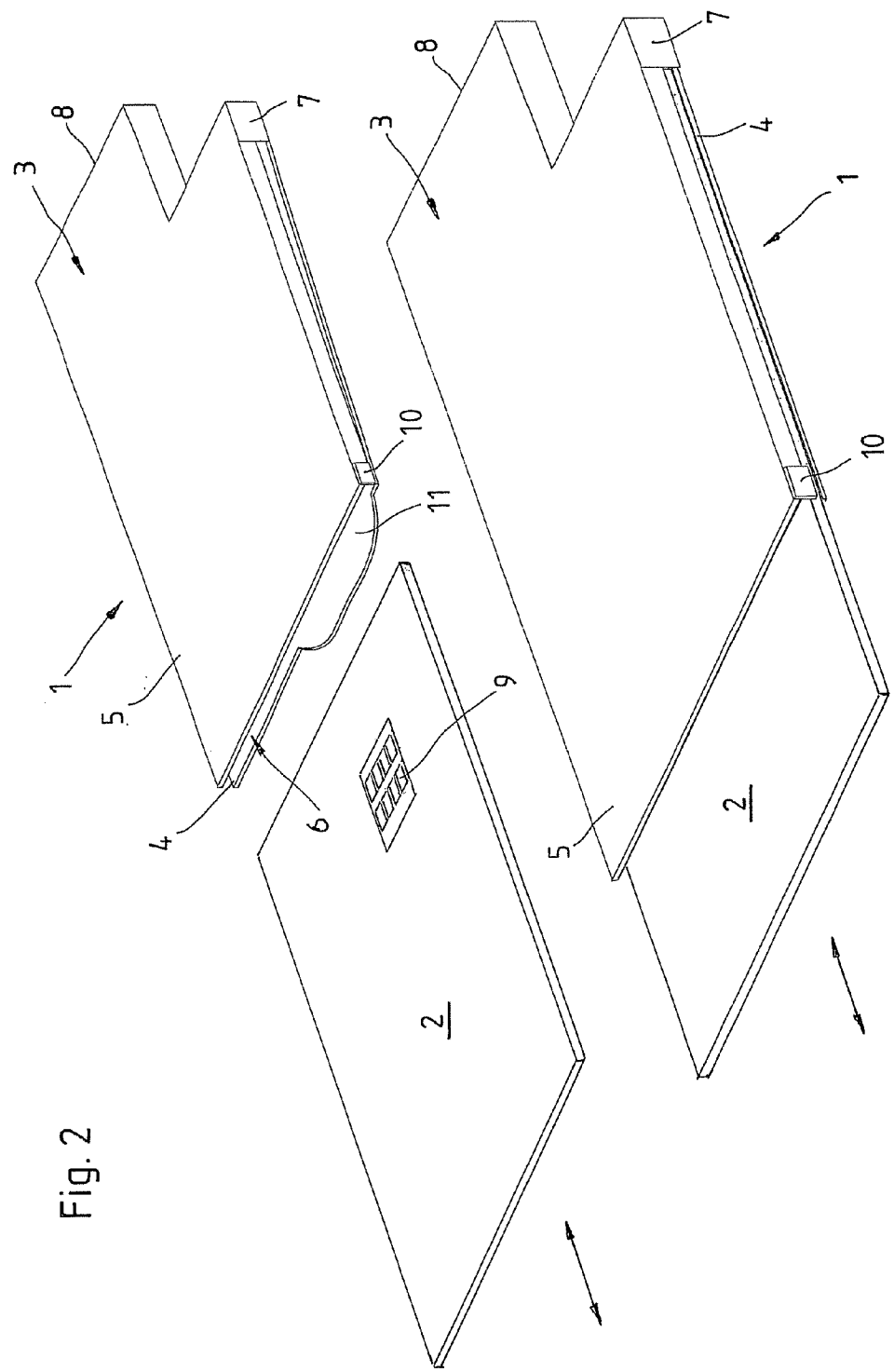
FIG. 2—schematic perspective view of a second practical example according to the invention.

FIG. 2 shows a second practical example of a contacting unit 1 according to the invention. An essential difference relative to the variant according to FIG. 1 consists of the fact that the guide device is arranged on the cover plate 5. In both cases, the guide device 10 is designed as a stub-like shoulder and is arranged in the front-most area of the contacting unit 1.

On the front, an introduction lip 11 is arranged, which is designed as one piece with the base plate 4. The introduction lip 11 is arranged off-center, so that during introduction of the contacting unit 1 into a device (not shown), the contacting unit experiences a lateral force component and, in the depicted practical example, in the direction of the side of the contacting unit facing away from guide device 10. The purpose of this is that the contacting unit 1 is securely guided along the walls of the slots accommodating the contacting unit.

Figure 3:
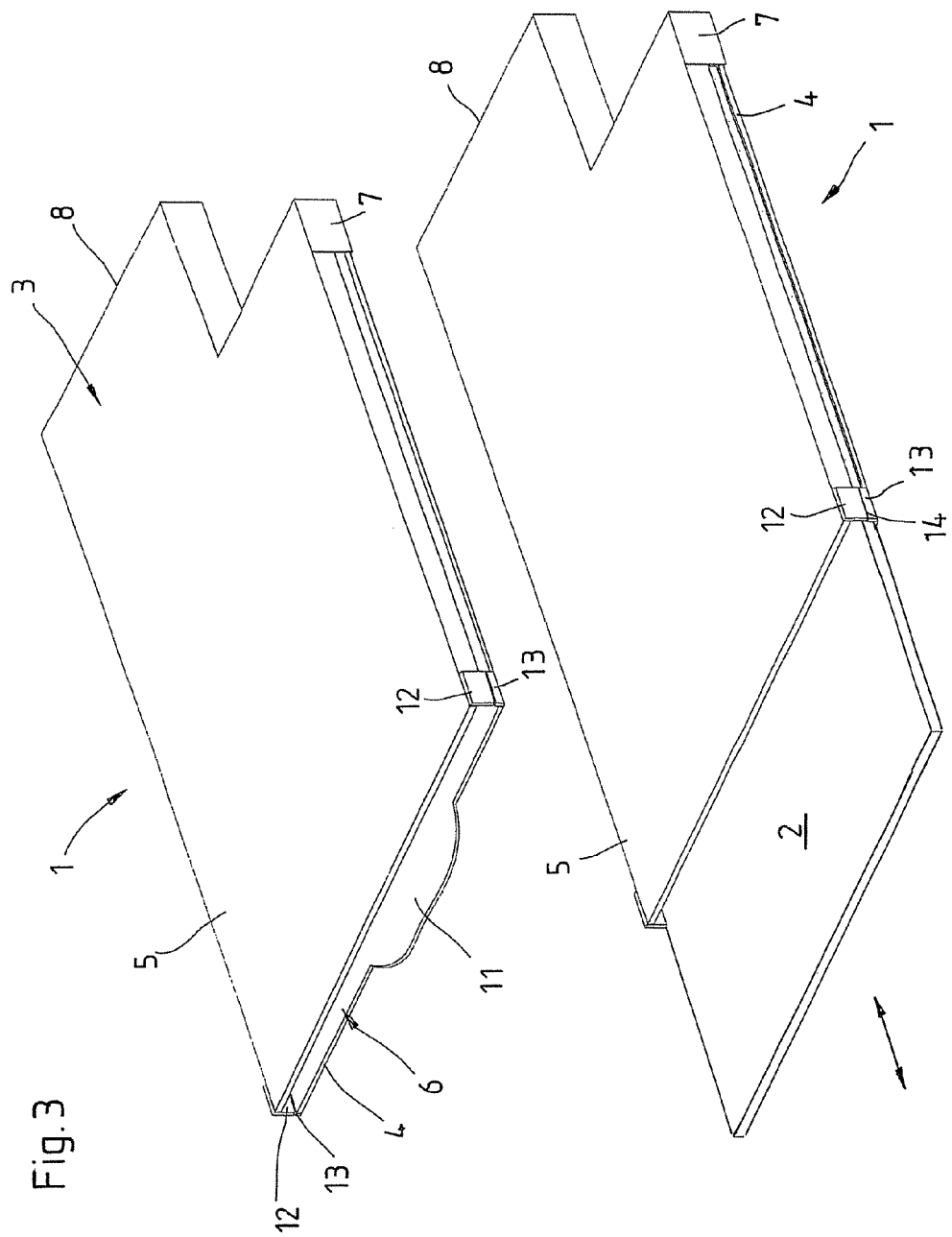
FIG. 3—schematic perspective view of a third practical example according to the invention.

FIG. 3 shows an essential further development of the invention. The guide device according to the invention has a shoulder 12 and a corresponding stop 13. The shoulder 12 and stop 13 come in contact on a contact surface 14. By this expedient according to the invention, the height of the plug-in channel 6 is set. The further shoulder 12 extends downward, the larger it is and the larger the height of the plug-in channel 6. This practical example has significant advantages with reference to production of contacting unit 1. Despite tolerances related to manufacture, a contacting unit can be manufactured that always has defined dimensions. In addition to the required lateral guiding, reliable introduction of the chip card 2 with simultaneously defined clamping force is also always guaranteed.

In the depicted practical example, the stop 13 is designed as a separate shoulder. As an alternative, the stop 13 can also be formed by the base plate 4 itself. It goes without saying that the shoulder 12 can also be arranged on the lower plate 4 and then cooperates with a stop assigned to the cover plate 5.

FIG. 4 schematically depicts a use example of the contacting unit 1 according to the invention. This is a double-slot version with a width of 68 mm, in which each slot 15, 16 is 34 mm. Accordingly, two individual contacting units with a width of 34 mm can be inserted into the slot. The contacting unit with a width of 54 mm is depicted. This design is known as PCMCIA-ExpressCard. The contacting unit is only contacted with a plug part 17 via slot 15. During insertion of the contacting unit 1 into the double-slot, the contacting unit slides along the wall 18 of the slot. The wall 18 provides lateral guiding during insertion of the chip card 2 into the contacting unit 1. On the other side of the contacting unit 1, the wall 19 is offset from the contacting unit 1. According to the invention, the guide device 10 is therefore provided, as already described previously. Secure contacting is guaranteed because of this guide device.

LIST OF REFERENCE NUMBERS

1 Contacting unit
2 Chip card
3 Housing
4 Base plate
5 Cover plate
6 Plug-in channel
7 Connection area
8 Connection area
9 Contact field
10 Guide device
11 Guide lip
12 Shoulder
13 Stop
14 Contact surface
15 Slot
16 Slot
17 Plug part
18 Wall
19 Wall

The invention claimed is:

1. A contacting unit, especially according to the Personal Computer Memory Card International Association (PCMCIA) Standard, with a plug-in card-shaped housing, comprising a base plate and a cover plate essentially congruent in at least in the transverse direction, between which a slit-like plug-in channel that opens on one end of the housing is formed to receive a chip card, and which is provided on the other side with a connector strip, and with a circuit board arranged parallel to the plug-in channel in the housing, which is electrically connected to the connector strip and provided on its surface with a contact field for contacting of the chip card, in which the plug-in channel includes openings on both lateral sides essentially over an entire length of the channel in the plug-in direction of chip card, and in which the base plate and the cover plate are firmly connected to each other only in the area adjacent to the plug-in channel in the plug-in direction, wherein at least one lateral guide device is directly connected to a lateral edge of either the base plate or the cover plate so as to at least partially bound the opening at least one of the lateral sides of the plug-in channel.

2. The contacting unit according to claim 1, wherein by the fact that the guide device has stub-like shoulders.

3. The contacting unit according to claim 1, wherein by the fact that the guide device extends at least over the height of the plug-in channel.

4. The contacting unit according to claim 1, wherein by the fact that the guide device has at least one shoulder assigned to the cover plate or base plate, which cooperates with the stop assigned to the other plate.

5. The contacting unit according to claim 4, wherein by the fact that a shoulder and a corresponding stop are arranged in a plane essentially perpendicular to the plug-in channel.

6. The contacting unit according to claim 4, wherein by the fact that the shoulder and stop determine the height of the plug-in channel.

7. The contacting unit according to claim 1, wherein by the fact that the plug-like shaped housing has an introduction lip for the support element, which is arranged off-center.

* * * * *